US 7,366,270 B2

(12) United States Patent
Tang et al.

(10) Patent No.: US 7,366,270 B2
(45) Date of Patent: Apr. 29, 2008

(54) PLL/DLL DUAL LOOP DATA SYNCHRONIZATION UTILIZING A GRANULAR FIFO FILL LEVEL INDICATOR

(75) Inventors: Benjamin Tang, Hawthorne, CA (US); Scott Southwell, Dogwood, CA (US); Nicholas Robert Steffen, Redondo Beach, CA (US)

(73) Assignee: Primarion, Inc., Tempe, AZ (US)

( * ) Notice: Subject to any disclaimer, the term of this patent is extended or adjusted under 35 U.S.C. 154(b) by 1069 days.

(21) Appl. No.: 10/029,709

(22) Filed: Dec. 20, 2001

(65) Prior Publication Data

US 2002/0075980 A1     Jun. 20, 2002

Related U.S. Application Data

(60) Provisional application No. 60/257,187, filed on Dec. 20, 2000.

(51) Int. Cl.
 H04L 7/00 (2006.01)
 H03D 3/24 (2006.01)
 H03L 7/00 (2006.01)

(52) U.S. Cl. ............... 375/372; 375/376; 370/517; 327/161

(58) Field of Classification Search ........ 375/371–373, 375/376; 370/505–506, 516–519; 713/500–503; 327/151, 153, 160–161
See application file for complete search history.

(56) References Cited

U.S. PATENT DOCUMENTS

| | | | |
|---|---|---|---|
| 4,180,799 A * | 12/1979 | Smith ..................... | 340/146.3 |
| 4,759,041 A | 7/1988 | Anderson et al. | |
| 4,811,340 A * | 3/1989 | McEachern et al. ........ | 370/505 |
| 4,823,321 A * | 4/1989 | Aoyama .................... | 365/189 |
| 4,920,547 A * | 4/1990 | Murakami ................. | 375/363 |
| 4,941,156 A | 7/1990 | Stern et al. | |
| 5,007,070 A | 4/1991 | Chao et al. | |

(Continued)

FOREIGN PATENT DOCUMENTS

EP     0 716 519 A     6/1996

(Continued)

OTHER PUBLICATIONS

PCT International Search Report; Sep. 16, 2002; PCT/US01/50654; 4 pgs.

*Primary Examiner*—Young T. Tse
(74) *Attorney, Agent, or Firm*—Noblitt & Gilmore, LLC

(57) ABSTRACT

A dual loop (PLL/DLL) data synchronization system and method for plesiochronous systems is provided. In particular, a system and method for dual loop data synchronization using a granular FIFO fill level indicator is provided. A dual loop data serializer includes a phase lock loop (PLL) and a delayed lock loop (DLL) configured with a phase shifter in the feedback path of the PLL. The dual loop serializer locks to the input of the DLL, which represents a fill level of a FIFO. A granular FIFO fill level indicator of the DLL provides input to the phase shifter to adjust the frequency of the PLL accordingly. Thus, the frequency of the data input rate can be controlled and a constant fill level of the FIFO can be maintained. A dual loop retimer includes a dual loop serializer (PLL/DLL) and a clock recovery DLL. The retimer resets the jitter budget to meet transmission requirements for an infinite number of repeater stages.

14 Claims, 12 Drawing Sheets

U.S. PATENT DOCUMENTS

| | | | | |
|---|---|---|---|---|
| 5,263,056 A * | 11/1993 | Urbansky | ............... | 375/363 |
| 5,263,057 A * | 11/1993 | Nawrocki et al. | ............... | 375/118 |
| 5,450,549 A * | 9/1995 | Casparian | ............... | 395/250 |
| 5,757,297 A | 5/1998 | Ferraiolo et al. | ............... | 341/100 |
| 5,802,122 A * | 9/1998 | Niegel | ............... | 375/372 |
| 5,835,543 A * | 11/1998 | Mazzurco et al. | ............... | 375/372 |
| 5,859,882 A * | 1/1999 | Urbansky | ............... | 375/375 |
| 6,038,254 A | 3/2000 | Ferraiolo et al. | ............... | 375/232 |
| 6,101,329 A * | 8/2000 | Graef | ............... | 395/872 |
| 6,167,100 A * | 12/2000 | Eastty et al. | ............... | 375/372 |
| 6,415,006 B2 * | 7/2002 | Rude | ............... | 375/372 |
| 6,449,281 B1 * | 9/2002 | Smith | ............... | 370/419 |
| 6,654,370 B1 * | 11/2003 | Quirke et al. | ............... | 370/389 |
| 6,696,892 B1 * | 2/2004 | Behzad | ............... | 330/51 |
| 6,901,126 B1 * | 5/2005 | Gu | ............... | 375/355 |
| 2002/0191724 A1 * | 12/2002 | Bleisteiner et al. | ............... | 375/372 |
| 2003/0217220 A1 * | 11/2003 | Lee et al. | ............... | 710/313 |
| 2003/0227988 A1 * | 12/2003 | Subrahmanyan et al. | ............... | 375/372 |

FOREIGN PATENT DOCUMENTS

WO      WO 00 46949 A      8/2000

* cited by examiner

CONVENTIONAL PLESIOCHRONOUS SYSTEM

DUAL LOOP SERIALIZER

DUAL LOOP RETIMER

DUAL LOOP RETIMER

GRANULAR FIFO FILL LEVEL INDICATOR SYSTEM

COUNTER BASED FIFO FILL LEVEL INDICATOR SYSTEM

LOGIC LEVEL IMPLEMENTATION OF SYSTEM 900

LOGIC LEVEL IMPLEMENTATION OF SYSTEM 1100

PLL/DLL DUAL LOOP DATA SYNCHRONIZATION UTILIZING A GRANULAR FIFO FILL LEVEL INDICATOR

CROSS REFERENCE TO RELATED APPLICATIONS

This application includes subject matter that is related to and claims priority from U.S. Provisional Patent Application Ser. No. 60/257,187, filed Dec. 20, 2000 and entitled "Granular FIFO Fill Level Indicator for Multi-Period Asynchronous Data Phase Detection." This application further includes subject matter related to U.S. patent application Ser. No. 10/029,956, filed on even date herewith, and entitled "PLL/DLL Dual Loop Data Synchronization."

FIELD OF INVENTION

The present invention relates generally to a system and method for data synchronization and, in particular, to an improved phase locked loop/delayed lock loop (PLL/DLL) "dual loop" approach to data synchronization. More particularly, the present invention relates to a system and method for dual loop data synchronization using a granular FIFO fill level indicator.

BACKGROUND OF THE INVENTION

Synchronization in data communication is often composed of several levels, with the highest level(s) involving methods like correlation and the lowest levels involving clock and data recovery (CDR). The lowest levels of synchronization occur first and often dictate the quality of synchronization available at the highest levels; thus it is desirable to ensure high quality and efficient data synchronization at the lowest levels.

Clock generation and distribution is a significant challenge in the design of large and complex digital systems. Ordinarily, clock generation and distribution can be well controlled in small systems and subsystems. For instance, synchronous signaling, where the data signal timing is related to a single timing reference (i.e., global reference), can be used for practically all critical high-speed signals. FIG. 1 illustrates a basic conventional topology for a synchronous system.

Synchronous clocking systems, such as the Synchronous Optical Network (SONET), use a single timing model. Originally developed for transmission of telecommunications signals such as voice, SONET is now the prevalent transport infrastructure for the wide area network (WAN) backbone. The primary benefit of the synchronous transmission and multiplexing hierarchy defined by SONET, is that multiple data streams at the defined rates can be combined (multiplexed), without bit stuffing into a higher rate stream, and can be extracted without demultiplexing the entire higher rate stream. Although the SONET method works well and has been in use for large backbone telecom networks, it is an expensive and complex system.

FIG. 2 illustrates a conventional topology for a plesiochronous system, where, unlike the synchronous system, each subsystem is designed to have its own local clock generation and distribution. A plesiochronous system is defined as one where the local clocks operate at approximately the same frequency such that the difference in frequency between any two subsystems is bounded to a small difference. For example, Infiniband™ networks are designed such that the local references are within +/−100 ppm of the ideal timing reference. To accommodate the differences in data periods due to the frequency differences, the conventional plesiochronous system employs bit stuffing techniques, where special bits are either added or deleted to adjust the rate of an incoming data stream to the frequency of the system receiving the data stream. With continued reference to FIG. 2, digital subsystem 1 transmits at a frequency of Fc1. Subsystem 2 has a clock rate of Fc2 which is close to the frequency of Fc1, but not exact. In order for subsystem 2 to use the data at its clock rate of Fc2, frequency compensation must be performed on the Fc1 data stream. Thus, the intra-system interfaces require data transmitted synchronously from one subsystem, to be retimed or synchronized to the local reference in the receiving subsystem.

FIG. 3 illustrates a conventional data synchronization architecture for each subsystem in the plesiochronous system of FIG. 2. As shown, a basic function of the subsystem is to retime the received data and provide a clock (local reference) aligned to that data for further digital processing.

Phase locked loops (PLLs) and delayed locked loops (DLLs) are common systems used in the I/O interfaces of data communication systems. In these applications, the PLL and DLL closely track the input clock and help to improve overall system timing. However, the rising demand for high-speed I/O has created an increasingly noisy environment in which the PLL and DLL must function. Noise tends to cause the output clocks of the PLL and DLL to jitter from their ideal timing. With a shrinking tolerance for jitter in the decreasing period of the output clock, the design of low jitter PLLs and DLLs has become challenging. To reduce PLL jitter, the loop bandwidth should be set as high as possible. Unfortunately, design tradeoffs often constrain the PLL bandwidth to be well below the lowest operating frequency for stability reasons. These constraints can cause the PLL to have a narrow operating frequency range and poor jitter performance. Although a typical DLL is based on a delay line and, thus is simpler from a control perspective, it can have a limited delay range which leads to a set of problems similar to that of the PLL.

One attempt at improving clock and data recovery in a plesiochronous system is illustrated in FIG. 4. A clock-data recovery (CDR) 400 includes a dual loop configuration having a PLL 402 and a DLL 406. PLL 402 is configured in a conventional manner having a phase frequency detector (PFD) 403, a loop filter 412, and a voltage controlled oscillator (VCO) 414. A local reference is detected at PFD 403 and filtered through loop filter 412. Typically, loop filter 412 is configured as a wideband loop for suppressing the VCO phase noise below the loop bandwidth. VCO 414 is configured to generate an oscillating signal at a frequency proportional to the local reference by using a frequency divider (not shown) at the input of PFD 403.

DLL 406 includes a phase detector 407, which receives the incoming data, a digital loop filter 408, and a phase shifter 409. Digital loop filter 408 may be configured as a wideband loop to track input jitter. Phase shifter 409 may be, for example, an infinite range phase shifter, typically implemented as a multi-phase selector, and provides an input to decision circuit 410. Phase shifter 409 provides a variable phase shift of the phase shifter input such that a clock may be generated having phase and frequency components that can be varied relative to the VCO output. Decision circuit 410 receives the output of phase shifter 409 and provides an output consisting of retimed data. Generally, decision circuit 410 includes a high speed comparator or D-flip-flop that allows detection of small amplitude signals and regenerates the signals to normal amplitude by reclocking the input.

While this dual loop configuration may offer some advantages over the single loop systems, for example, individual loop optimization, the DLL bandwidth must be very wide to accommodate the input jitter. In CDR systems, it is often desirable to have a wide bandwidth; however, in other applications, this is not always the case. For example, a wide bandwidth CDR is not desirable if the output clock jitter must be kept low. The output clock jitter's relationship to the input clock jitter is the jitter transfer function. A low bandwidth jitter transfer function typically allows a lower clock jitter to be generated. This is because the high frequency jitter is reduced by the lowpass filtering properties of the jitter transfer function.

If several retiming operations occur in the CDR system, it is possible for a substantial amount of jitter to be introduced if the jitter transfer function of the retimer is such that the output jitter exceeds the input jitter. This typically occurs in a PLL based CDR due to peaking in the jitter transfer function caused by the second order nature of the system, i.e., two integrators; one in the PLL loop filter and one in the VCO. DLL based CDRs, such as CDR 400, generally exhibit little or no jitter peaking because they are first order systems. However, CDR 400 sustains a performance tradeoff in selection of the loop bandwidth, i.e., optimizing the jitter tolerance versus optimizing the jitter transfer.

Further, traditional first-in first-out (FIFO) indicators or flags tend to allow or enable phase detectors to exhibit non-linear behavior, i.e., non-linear transfer functions, such as exhibited in non-linear "bang-bang" phase detectors.

Accordingly, an improved system and method for data synchronization in a plesiochronous system is needed. Specifically, a system and method for improved data serialization and retiming having minimum jitter generation (e.g., wide loop bandwidth) and maximum jitter suppression (e.g., narrow loop bandwidth) is desired. In addition, a plesiochronous system and method for data recovery and retiming is needed which does not require bit stuffing.

SUMMARY OF THE INVENTION

An improved system and method for data synchronization is herein provided and, in particular, a dual loop system and method for data synchronization. In exemplary embodiments, a system and method includes a dual loop data serializer having a phase lock loop (PLL) and a delayed lock loop (DLL). Each loop has a loop filter configured to optimize performance of the serializer. The PLL including a phase shifter configured in the PLL feedback path.

A granular FIFO fill level indicator system and method generally includes a write counter, a read counter, a plurality of FIFO registers, and a comparison module. The granular indicator determines the FIFO fill level using inputs from the write and read counters.

In one exemplary embodiment, a granular FIFO fill level indicator system includes a counter based system. In this embodiment, the comparison module comprises a reset counter and a register. A terminal count from each counter is used to asynchronously reset a high-speed up-counter.

In another exemplary embodiment, a granular FIFO fill level indicator system includes a multi-phase detector based system. In this embodiment, the comparison module comprises a plurality of phase detectors and a binary decoder. Additional granularity is provided by sampling a greater number of write counter phases.

In other exemplary embodiments, a system and method includes a dual loop data retimer having a dual loop serializer and a digital delay lock loop (DDLL). The serializer having a PLL and a DLL with a configurable loop filter in each loop. The DDLL receiving input data and configured to recover a clock from the data.

BRIEF DESCRIPTION OF THE DRAWINGS

These and other features, aspects and advantages of the present invention will become better understood with reference to the following description, appending claims, and accompanying drawings where:

DETAILED DESCRIPTION

The present invention may be described herein in terms of various functional components and various processing steps. It should be appreciated that such functional components may be realized by any number of hardware or structural components configured to perform the specified functions. For example, the present invention may employ various other components and modules, such as buffers, filters, converters, and logic devices under the control of one or more microprocessors or other microcontrollers. In addition, the present invention may be practiced in any data communication context. However for purposes of illustration only, exemplary embodiments of the present invention will be described herein in connection with a data synchronization system. Further, it should be noted that while various components may be suitably coupled or connected to other components within exemplary circuits, such connections and couplings can be realized by direct connection between components, or by connection through other components and devices located thereinbetween.

A PLL/DLL dual loop data synchronization system and method is provided. Used herein, "dual loop" refers to a combined phase locked loop (PLL) and delay lock loop (DLL) synchronization system. As will be discussed in the following paragraphs, this improved technique for data synchronization in a plesiochronous environment allows functions such as clock recovery, serialization, and retiming to be carried out with improved performance over traditional methods.

Figure 5:
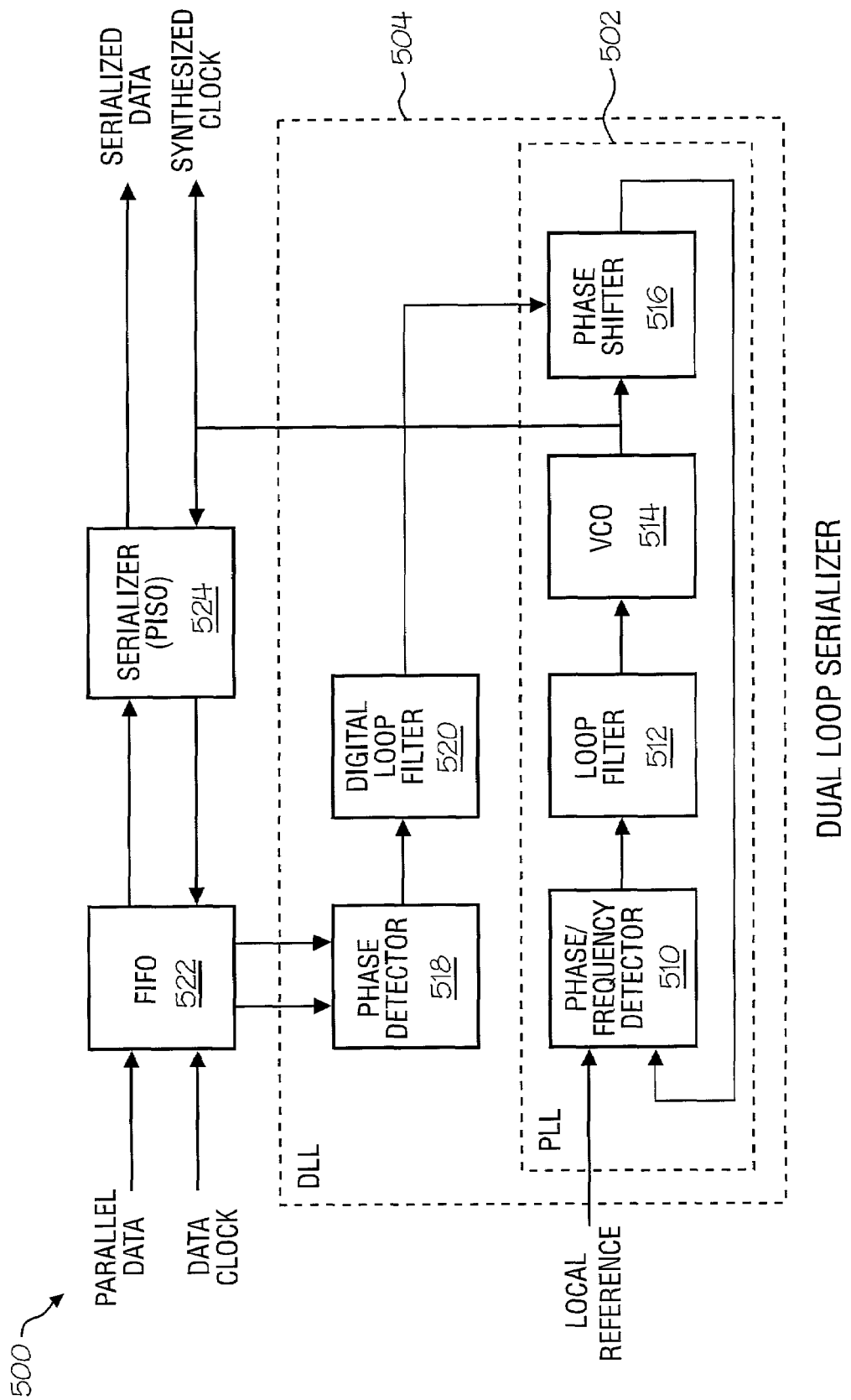
FIG. 5 illustrates, in block format, a dual loop serializer in accordance with one embodiment of the invention.

FIG. 5 illustrates an exemplary dual loop data serializer system 500 in accordance with one embodiment of the invention. Serializer system 500 is particularly suited for implementation in a plesiochronous system where each subsystem includes a local reference. In general, serializer system 500 receives a parallel data byte input, converts the data byte into a stream of serial data bits and transmits the serialized data (frequently to a deserializer). The serial data typically includes clock information, which if extracted, can be used to recover the serial data stream and reassemble the parallel byte.

Serializer system 500 includes a PLL 502 and a DLL 504 in a dual loop configuration. In one particular embodiment, PLL 502 is embedded within DLL 504; however, in other embodiments, the DLL and PLL may be separated. PLL 502 includes a phase frequency detector (PFD) 510, a loop filter 512, a VCO 514, and a phase shifter 516. DLL 504 also includes a phase detector 518 and a digital loop filter 520. In addition, serializer system 500 includes a FIFO buffer 522 (first-in first-out) and a PISO (parallel-in serial-out) serializer 524.

While phase frequency detector 510, loop filter 512 and VCO 514 can function similar to a traditional clock multiplier typically used in serializers, in the exemplary embodiment, PLL 502 includes phase shifter 516 configured in the feedback path of PLL 502. Thus, unlike a conventional data recovery system, which locks to the local reference, PLL 502 can suitably lock to the input clock of FIFO 522 that feeds phase detector 518 of DLL 504. In other words, while a conventional PLL is designed to lock to the local reference, PLL 502 is able to lock to the input of DLL phase detector 518 by placing phase shifter 516 in the feedback path of PLL 502. In addition, phase shifter 516 allows PLL 502 to accommodate small frequency offsets in the reference clock relative to the parallel data rate.

The frequency from PLL 502 can be adjusted to match the desired data rate. In this manner, the data into FIFO 522 contains a jittery clock, i.e., the clock is not stable due to the noise. A clean clock with jitter filtered out is thus desirable. Using the dual loop approach of the exemplary embodiment, a clean clock can be generated without jeopardizing the performance of the system by incorporating dual bandwidths. For instance, loop filter 512 of PLL 502 may include a relatively wide bandwidth to suppress VCO phase noise and generate the low jitter clock. On the other hand, loop filter 520 of DLL 504 may include a narrow bandwidth to filter the noise from the data clock that is being read into FIFO 522. The net effect is to generate a synthesized clock that is very clean because it has been filtered from the data clock at a low bandwidth by filter 520, yet still suppresses the VCO noise due to the wide bandwidth of filter 512.

Phase detector 518 in DLL 504 monitors FIFO 522 fill level (write minus read) and adjusts the output phase so that the transmit clock maintains a constant FIFO fill rate. The parallel data is registered with its own reference clock (data clock) and FIFO 522 is used to provide a larger timing window for data serializer 524. Serializer 524 may be, for example, a parallel-in serial-out (PISO) data multiplexer operating at the synthesized transmit clock.

In operation, serializer system 500 receives a local reference (such as a local clock in a plesiochronous system) at PFD 510. Loop filter 512, being coupled to PFD 510 and VCO 514, may comprise any suitable components to preferably provide a wide bandwidth filter. In this manner, loop filter 512 is configured to suppress phase noise from VCO 514. Phase shifter 516 receives the local reference from VCO 514 and also receives a signal from digital loop filter 520 of DLL 504. Configured in a feedback loop of PLL 502, phase shifter 516 provides a variable phase shift relative to the VCO output to PFD 510. The outputs of PFD 510 are integrated by loop filter 512 which provide a control voltage that modifies the output frequency of VCO 514. In this manner, the control loop adjusts the phase and frequency of VCO 514 such that the two inputs to PFD 510 maintain a fixed relative phase. Parallel data and a data clock are received at FIFO 522. A signal representative of the fill rate of FIFO 522 is received at phase detector 518 of DLL 504. Phase detector 518 translates the FIFO fill level into a value that is integrated by loop filter 520 to produce a phase shift in PLL 502. Thus an offset in the FIFO fill level corresponds to a frequency offset in the PLL relative to the local reference clock. In this manner, DLL 504 can modify the phase and frequency of VCO 514 so that the FIFO fill level is nearly constant. Further, VCO 514 output is phase-locked to FIFO 522 data clock with a narrowband loop set by DLL 504 bandwidth; thus, providing a low bandwidth jitter transfer function with little or no peaking. Outside of the bandwidth of DLL 504, VCO 514 output may be phase locked to the PLL frequency reference; thus, providing wideband suppression of VCO 514 phase noise. Accordingly, a synthesized low jitter clock is output.

This dual loop, dual bandwidth approach of the invention allows individual optimization of the PLL and DLL loop characteristics to improve overall system performance. For instance, jitter in the data rate is rejected since the DLL loop bandwidth can be set arbitrarily low without impacting the PLL jitter generation. Moreover, serializer 500 offers significant advantages over a traditional serializer. For instance, a conventional serializer requires the data rate and the reference clock to be phase locked, which limits its usefulness in a plesiochronous system. If a clean reference is not available, then the "dirty" data clock must be used, resulting in a noisier output clock. Using the techniques disclosed herein, a clean reference is available since the reference matches the input data rate to within a small frequency offset.

In addition to performance advantages, the dual loop approach of serializer system 500 offers substantial architectural flexibility. The DLL lends itself well to a fully digital element. This facilitates the implementation by reducing the number of analog components. As is widely recognized in the industry, analog loops can be highly sensitive causing the jitter transfer function to deviate if the component values change. In present serializer system 500, the DLL may be built around a purely digital element so the digital loop filter sets the jitter transfer bandwidth and the transfer function will be the same from system to system. Additionally, the transmit rate is set by the data rate. Therefore, frequency compensation, such as bit stuffing, is not required in this plesiochronous system. Moreover, the present system can accommodate asynchronous data transfer, where the parallel data is written in bursts as long as the FIFO depth and fill rates are consistent with the maximum phase update rate.

Figure 6:
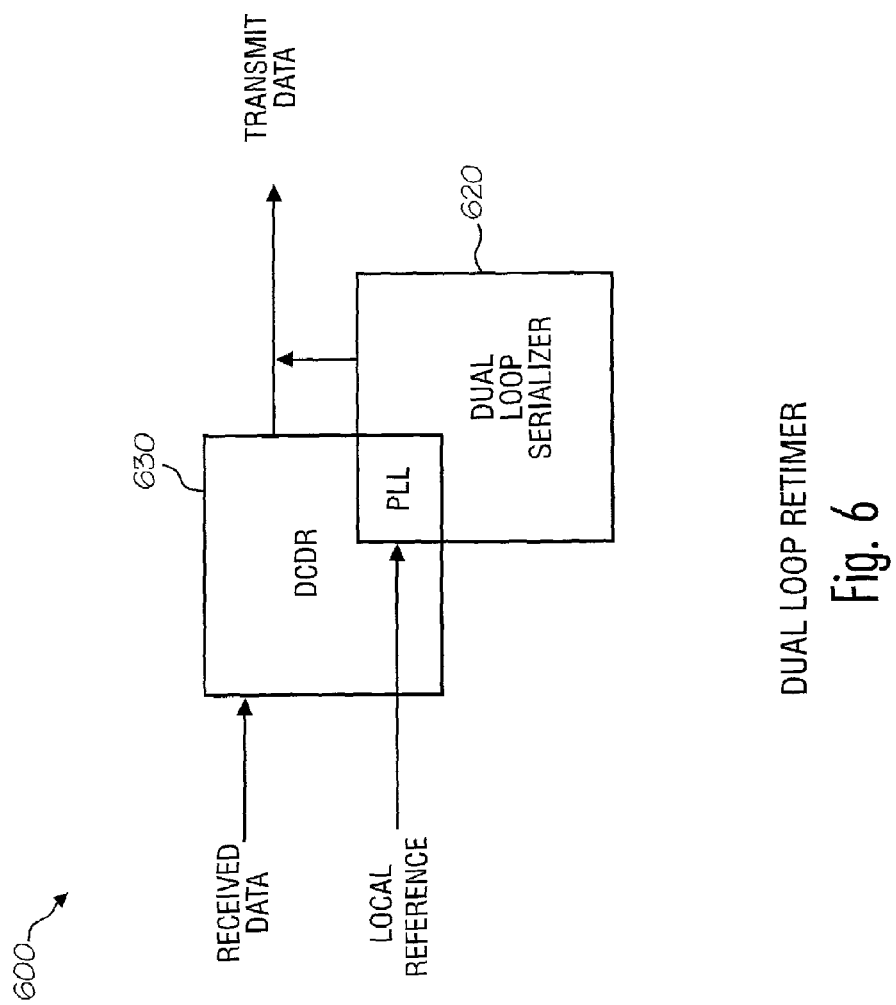
FIGS. 6 and 7 illustrate, in block format, dual loop retimers in accordance with various embodiments of the invention.

FIG. 6 illustrates, in block format, a dual loop retimer system 600 in accordance with another embodiment of the invention. In general, a retimer system recovers the clock from the received input data and retransmits the data with a clean output clock. Although not illustrated in the present figure, retimers basically include a clock recovery deserializer followed by a serializer.

Figure 1:
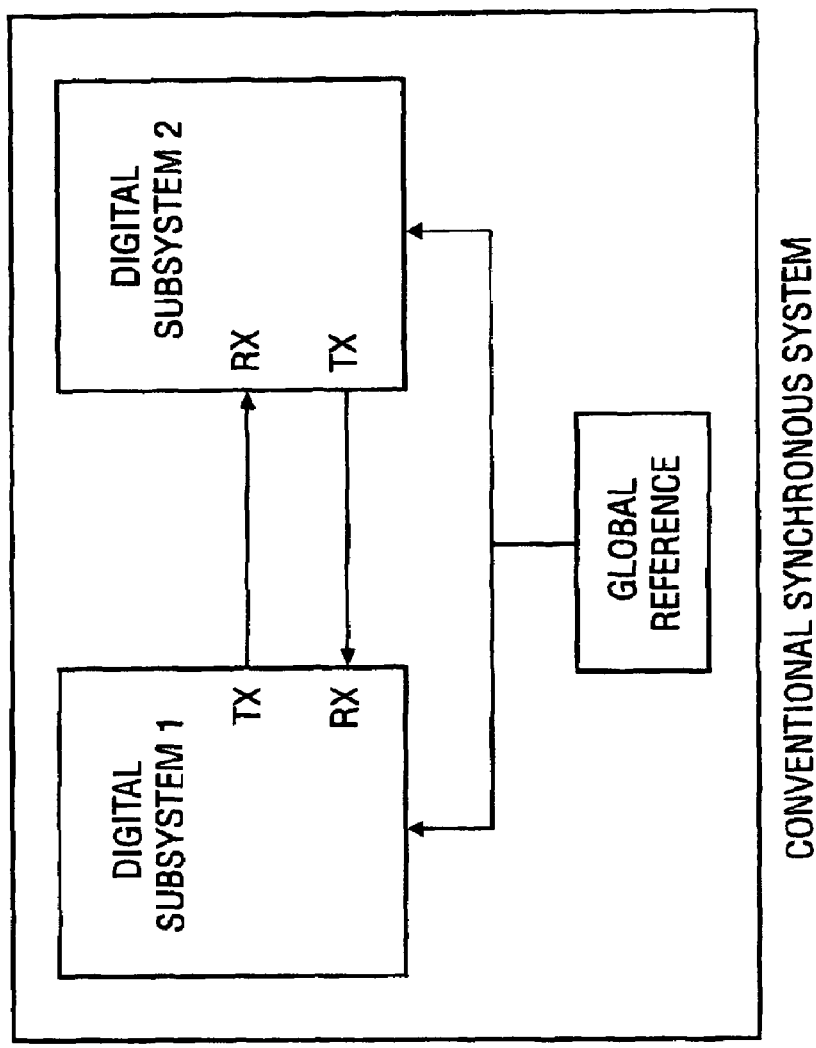
FIG. 1 illustrates, in block format, a conventional synchronous system architecture.
Figure 2:
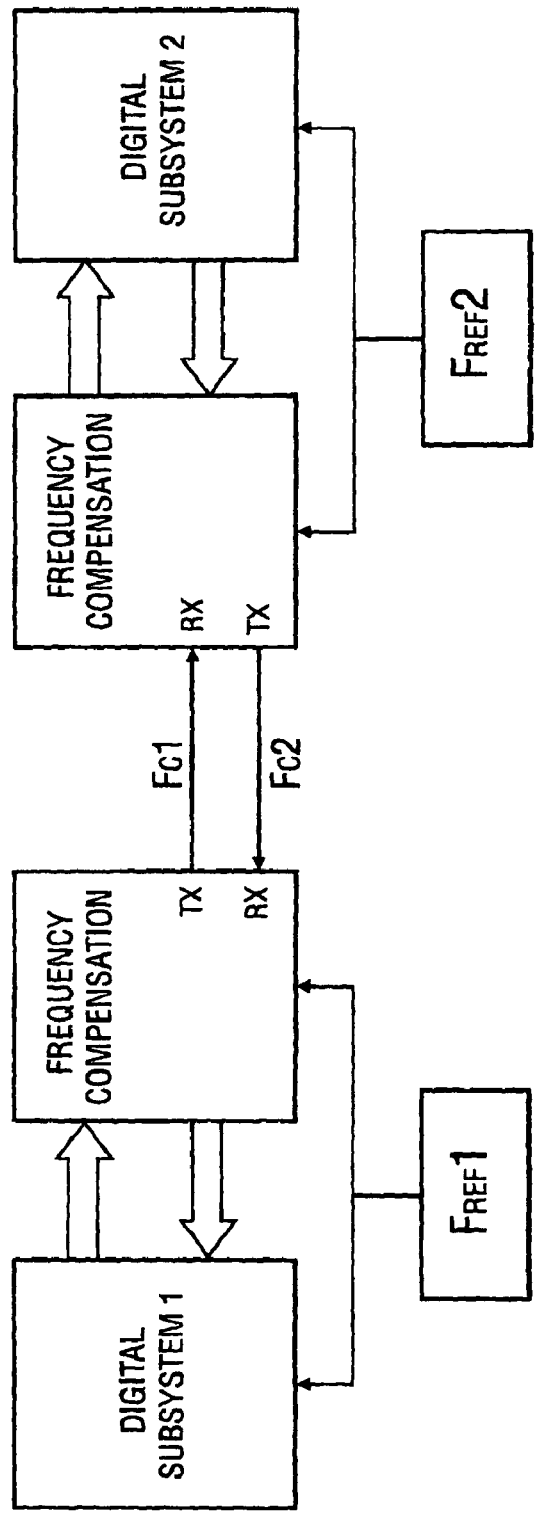
FIG. 2 illustrates, in block format, a conventional plesiochronous system architecture.
Figure 3:
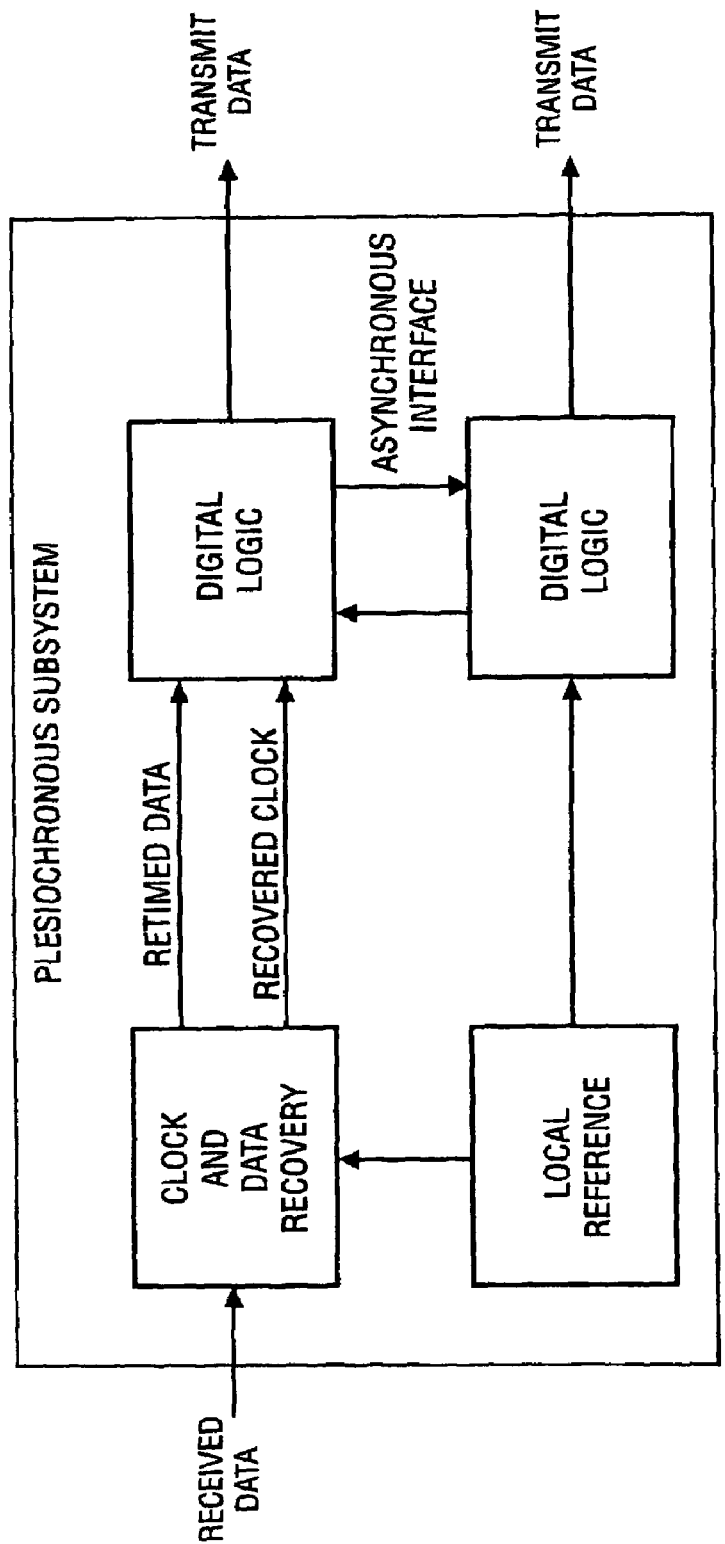
FIG. 3 illustrates, in block format, a conventional plesiochronous subsystem.
Figure 4:
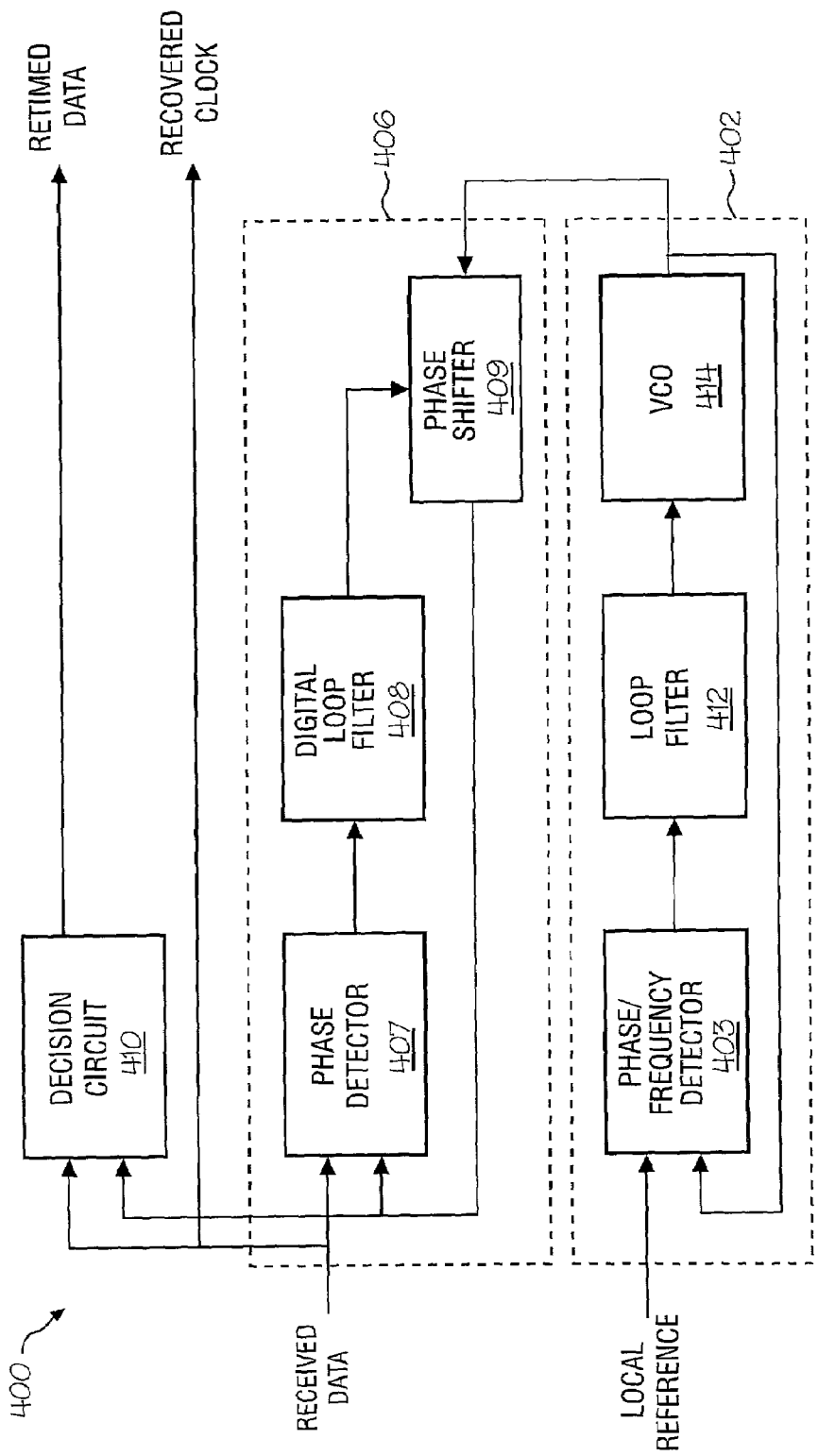
FIG. 4 illustrates, in block format, a dual loop CDR of the prior art.

In this particular embodiment, retimer 600 is implemented as a combination of a dual loop serializer 620 (e.g., serializer 500) and digital clock and data recovery (DCDR) 630 (e.g., CDR 400). Individually, serializer 620 and DCDR 630 may each include a PLL; however, when combined, a retimer in accordance with an exemplary embodiment of the invention may use a single analog PLL to generate the transmit clock. However, in other embodiments, multiple PLLs may be used. The DLL of serializer 620 provides frequency compensation and phase alignment to the data as in serializer 500 of FIG. 5. The clock recovery of retimer 600 is slaved off the PLL, and provided by a second DLL, as in the plesiochronous CDR 400 of FIG. 4.

Figure 7:
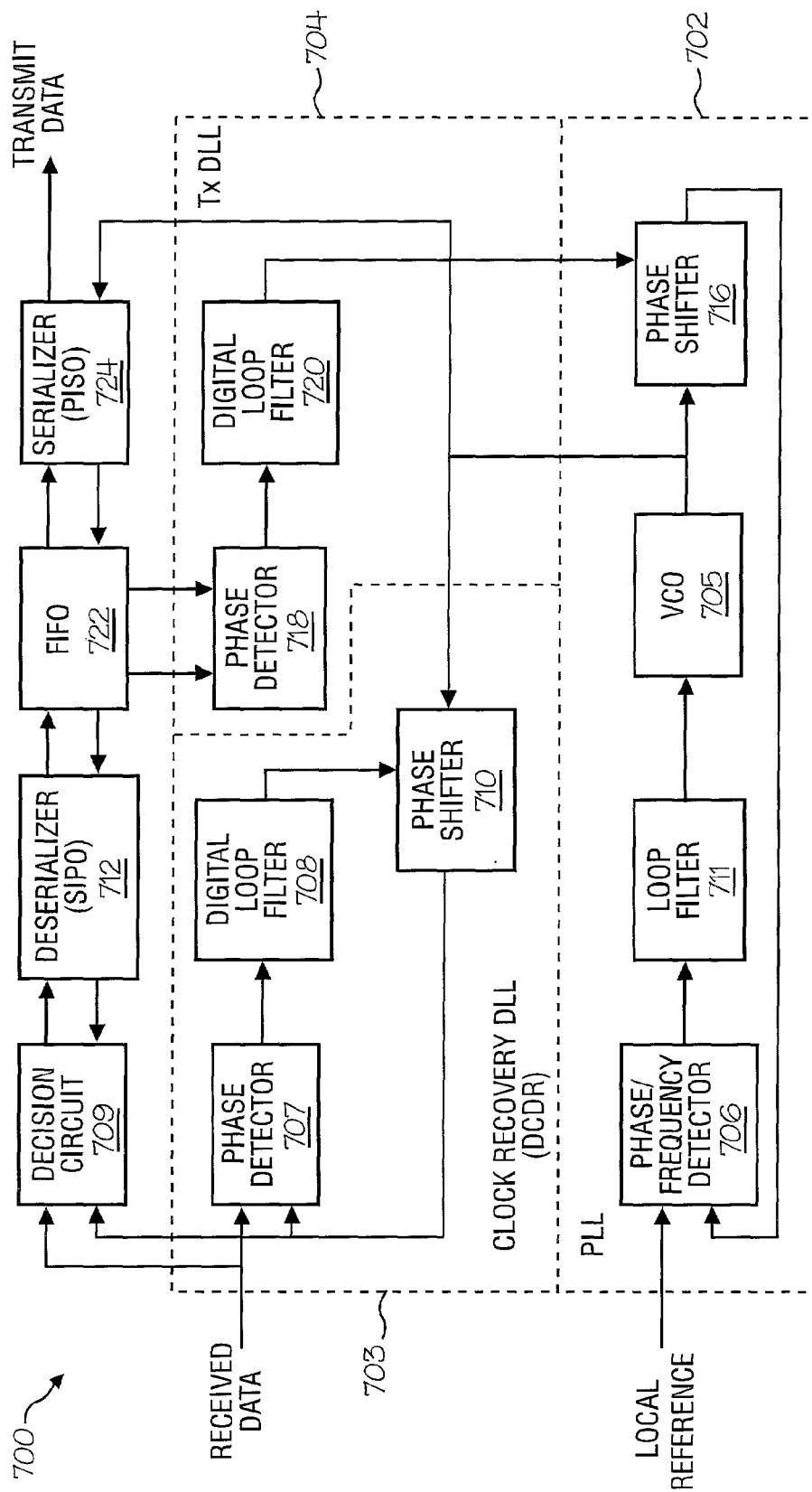

Referring now to FIG. 7, an exemplary block diagram of the retimer of FIG. 6 is illustrated. Retimer 700 includes a dual loop senalizer, comprising PLL 702 and DLL 704, and a DCDR, comprising DLL 703 and PLL 702. As previously discussed, in accordance with an exemplary embodiment of the invention, a single analog PLL 702 is used which includes a phase shifter. Analog PLL 702 provides a reference frequency multiplication or, creates a serial clock that is close to a multiple of the target frequency. Similar to PLL 502 of senalizer 500, PLL 702 includes a PFD 706, a loop filter 711, a VCO 705, and a phase shifter 716.

Digital DLL 703 provides clock recovery in much the same manner as CDR 400 and similarly includes a phase detector 707, a digital loop filter 708, and a phase shifter 710. DLL 703 tracks the frequency offset in the plesiochronous system. Additionally, loop filter 708 of DLL 703 may be set as a wideband filter to track the input jitter and provide high jitter tolerance.

DLL 704 forms the DLL portion of serializer 500. As such, DLL 704 includes a phase detector 718 and a digital loop filter 720. Phase detector 718 is preferably configured to receive an input from FIFO 722 representative of FIFO 722 fill level. Digital loop filter 720 may use digital integration to drive phase shifter 716 of PLL 702. In addition, loop filter 720 of DLL 704 may be a narrowband filter to provide jitter filtering.

Retimer 700 further includes a decision circuit 709, a deserializer 712, a FIFO 722, and a serializer 724. Deserializer 712 is a serial-in parallel-out (SIPO) element. In other words, deserializer 712 receives a serial data stream, then converts and reassembles the serial data back into a parallel data byte, which is referenced to the clock. Decision circuit 709 allows detection of small amplitude signals and regenerates the signals to normal amplitude by reclocking the input with a high speed comparator. FIFO 722 and serializer 724 may be configured similar to previously described FIFO 522 and serializer 524.

In one particular embodiment, a dual loop retimer may include the elements as previously described for retimer 700, except deserializer 712 and serializer 724 may be omitted. In this embodiment, data may be written to the FIFO serially and the retimed data is read directly out of the FIFO.

Dual loop dual DLL retimer 700 offers significant advantages over traditional single loop and dual loop retimers. Unlike single loop retimers, the jitter transfer of the received data of retimer 700 is independently set from the jitter tolerance of the received data. This is because the jitter tolerance is set by the clock and data recovery DLL (DCDR) bandwidth (i.e., wide bandwidth) and the jitter transfer is set by the serializer DLL bandwidth (i.e., narrow bandwidth). Unlike conventional dual loop retimers, which may use multiple PLLs, retimer 700 may be implemented with a single analog PLL; thereby, simplifying the system and eliminating additional analog components. Furthermore, the combined DCDR and DLL function as cascaded DLLs rather than cascaded PLLs. Their filter responses generate a jitter transfer function that is a low pass transfer function with little or no jitter peaking. Thus, the retimer resets the jitter budget in such a way that an infinite number of repeater stages may be cascaded while still meeting the transmission requirement.

With continued reference to FIG. 7, a detailed discussion of various embodiments suitable for phase detector 718 (as well as phase detector 518 of FIG. 5) will follow. As previously mentioned, phase detector 718 is preferably configured to receive an input from FIFO 722 representative of FIFO 722 fill level. In this manner, phase detector 718 may have the function of a "fill detector" or "fill level indicator."

The characteristics of FIFO 722 are suitably monitored so that the FIFO fill level may be controlled. By adjusting the data input rate to the serializer (or retimer) in response to the FIFO fill level, the FIFO may be maintained at constant or nearly constant fill level. This information is then translated by phase detector 718 into an equivalent value that can then be used to determine at what rate to vary the phase in the phase shifter, such as phase shifter 716. The information can then be used to maintain a constant data flow rate matching the input rate into the system.

As discussed above, traditional FIFO indicators or flags, such as half full, almost full, full, almost empty, and empty, tend to allow or enable phase detectors to exhibit non-linear behavior, such as may be realized in a non-linear "bang-bang" phase detector. It would be very desirable to implement a phase detector which exhibits a linearized transfer function so the DLL (e.g., DLL 704) does not behave non-linearly. In accordance with an aspect of the present invention, a system and method for providing dual loop data synchronization using a FIFO fill level indicator can facilitate a more linearized transfer function in a phase detector.

Figure 8:
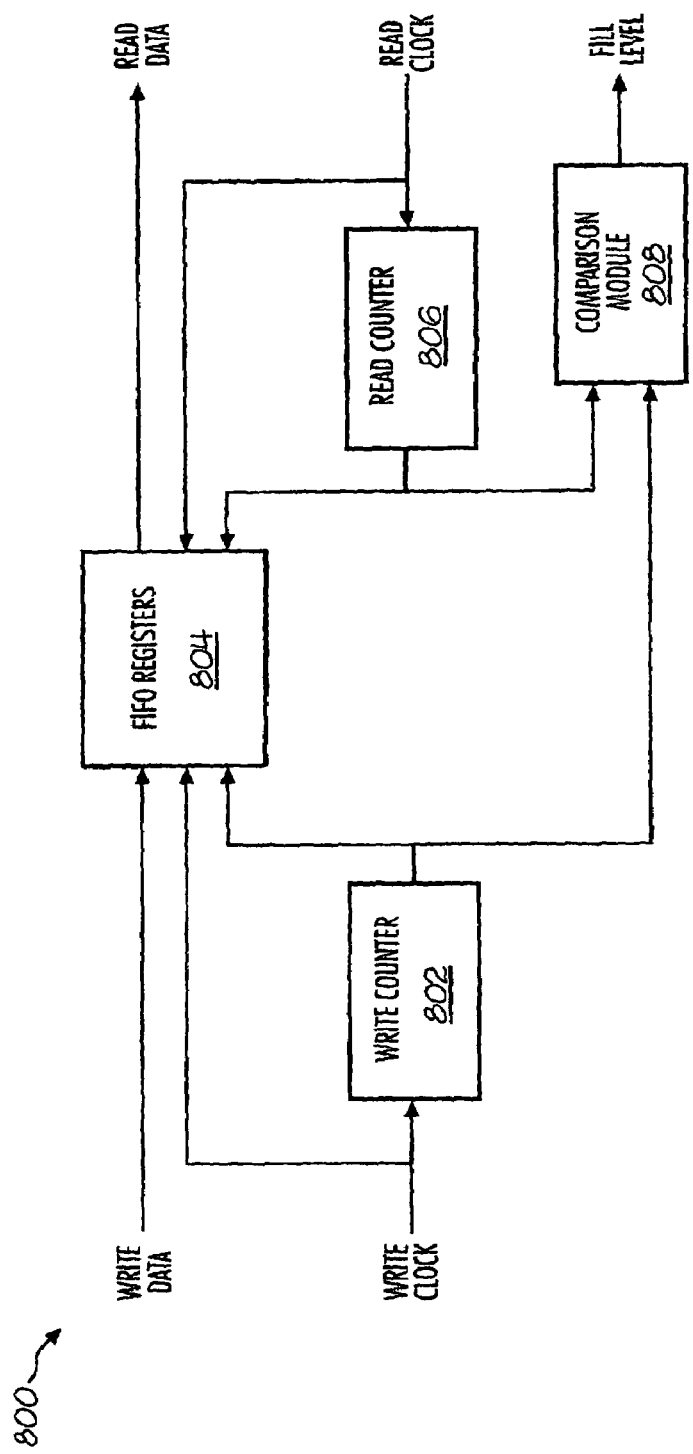
FIG. 8 illustrates, in block format, an exemplary conceptual granular FIFO fill level indicator.

FIG. 8 illustrates an exemplary block diagram of a granular FIFO fill level indicator system 800. FIFO fill level indicator system 800 is configured to facilitate the obtaining of a linear phase detector transfer function, which is highly desirable. Exemplary granular FIFO fill level indicator system 800 includes a write counter 802, a plurality of FIFO registers 804, a read counter 806, and a comparison module 808. Comparison module 808 can comprise various devices and components for performing comparing functions, such as subtraction. In this particular embodiment, granular FIFO fill level indicator system 800 uses comparison module 808 to determine a difference between a state in write counter 802 and a state in read counter 806. The difference is output from comparison module 808, which performs the difference function, and represents the fill level of FIFO registers 804. There may exist some difficulty in a direct implementation of FIFO fill level indicator system 800 because counters 802, 806 are generally asynchronous. In other words, the write clock and the read clock are not synchronized so the inputs received from counters 802 and 806 are generally not equally timed. Accordingly, the techniques to follow describe various embodiments for implementing a FIFO fill level indicator system 800 for data synchronization having asynchronous read and write clocks.

Figure 9:
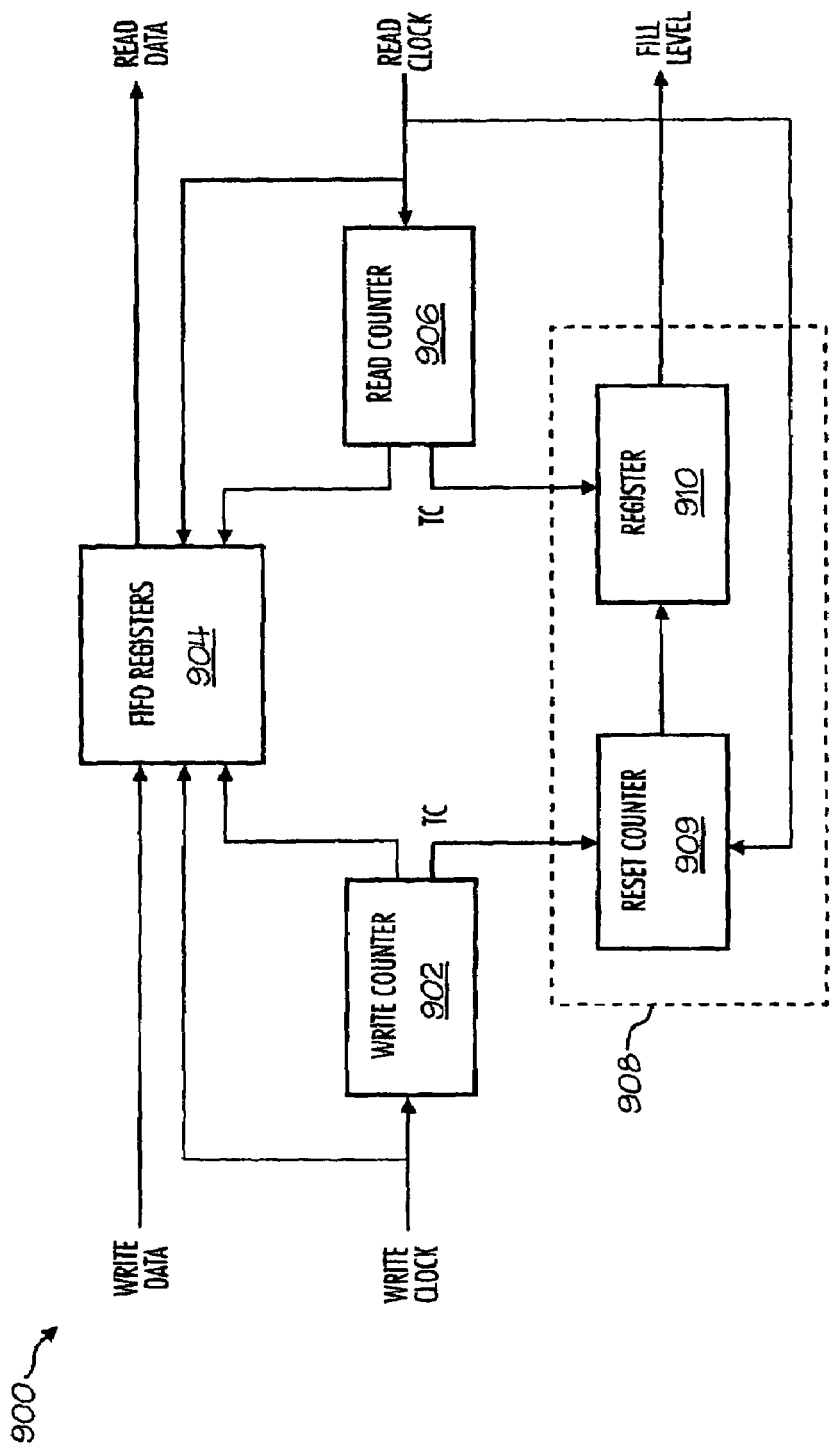
FIGS. 9 and 11 illustrate, in block format, various embodiments of a granular FIFO fill level indicator.

In accordance with one exemplary embodiment, with reference to FIG. 9, a counter based FIFO fill level indicator system 900 is illustrated in block format. Similar to granular system 800, counter based system 900 includes a write counter 902, a plurality of FIFO registers 904, a read counter 906, and a comparison module 908. In this particular embodiment, comparison module 908 includes a reset counter 909 and a register 910. Counter based system 900 represents one exemplary technique for sampling high speed write and read counters 902 and 906, respectively. The terminal count (shown as "TC" on the present Figure) of write counter 902 is used to asynchronously reset high-speed up-counter 909, which is clocked by the read clock reference. The output of reset counter 909 is then sampled by register 910, which is clocked by the terminal count of read counter 906.

In one particular embodiment, counter based system 900 provides the phase difference between write counter 902 and read counter 906 as a number of read counter cycles. The number of words in FIFO registers 904 correspond to the frequency offset. This offset can be used to generate an equivalent phase shift and change the frequency of the clock accordingly. Thus, by determining the number of words and generating an equivalent phase shift, system 900 can be used to maintain the word count at a desirable constant level.

Figure 10:
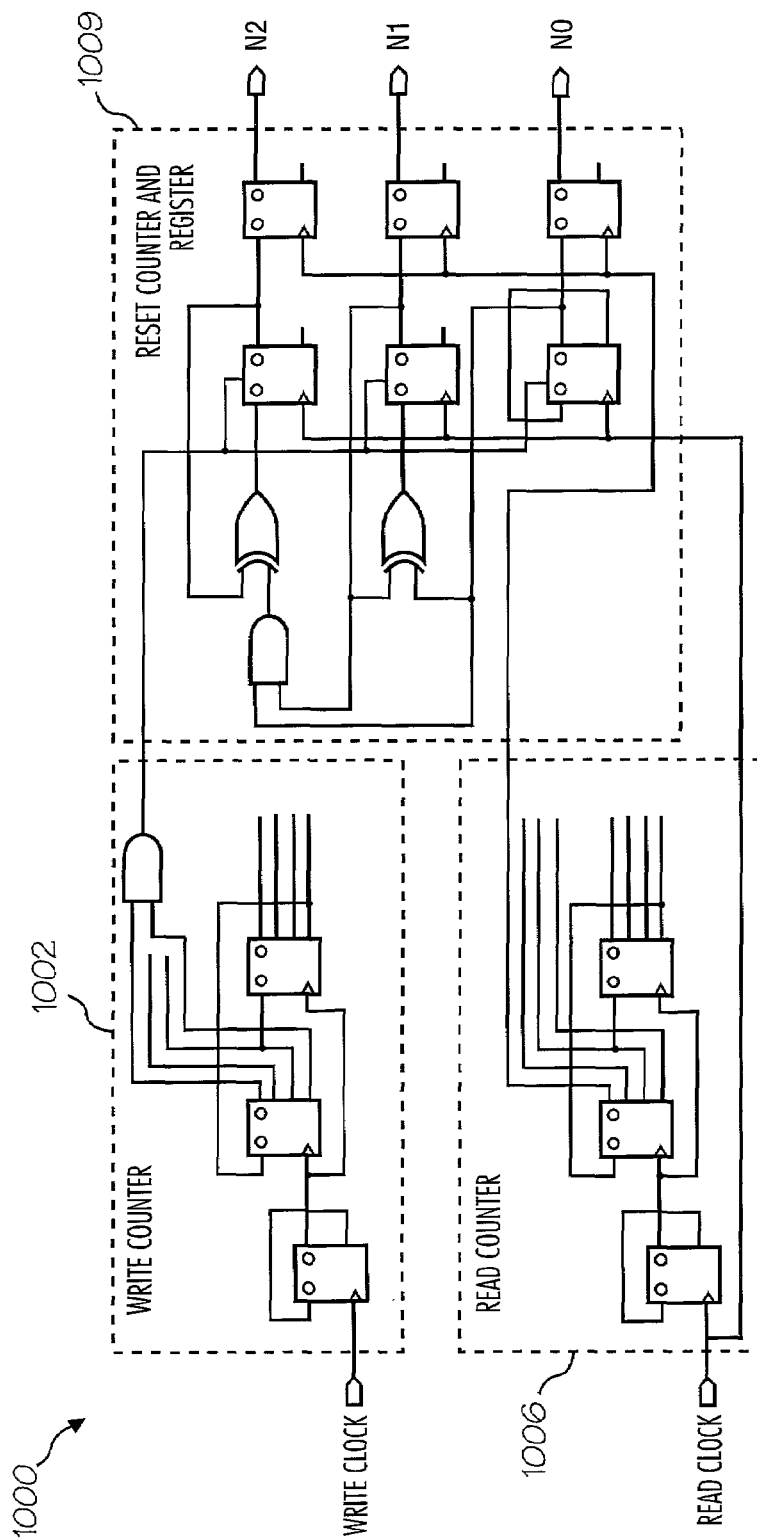
FIGS. 10 and 12 illustrate exemplary logic level implementations of systems 900 and 1100, respectively.

FIG. 10 illustrates one exemplary logic level implementation 1000 of counter based FIFO fill level indicator system 900. As illustrated, the write clock is received at a write counter 1002 and the read clock is received at a read counter 1006. Counters 1002 and 1006 are similar in function as previously described counters 902 and 906, respectively. Comparison module 908 is represented as reset counter and register 1009 on the present Figure. The digital outputs of block 1009 (shown as 3 bits, "N2" "N1" and "N0") represent the fill level.

Figure 11:
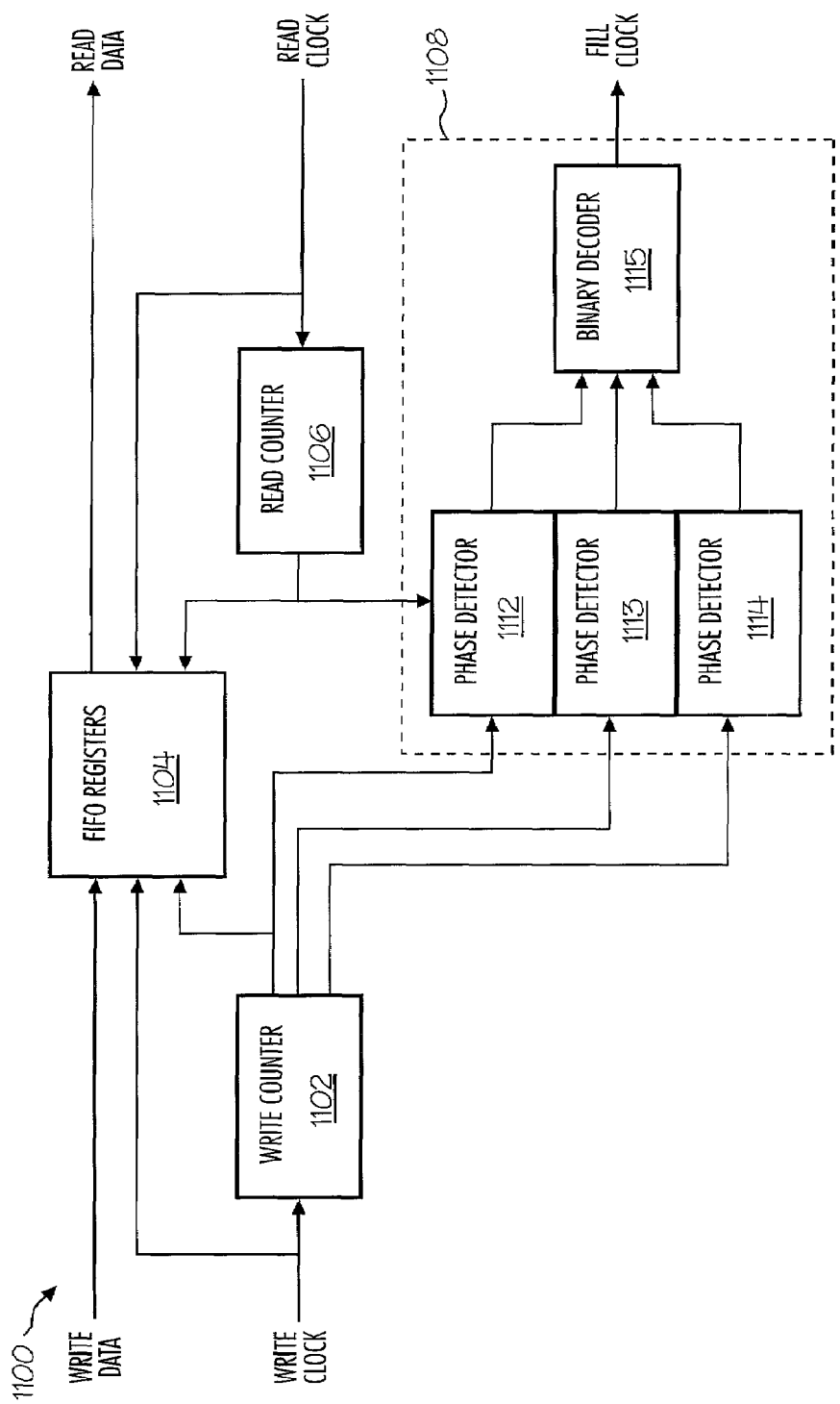

In accordance with another exemplary embodiment, with reference to FIG. 11, an exemplary multi-phase detector based FIFO fill level indicator system 1100 for sampling the high speed write and read counters is shown. Similar to system 800, multi-phase detector system 1100 includes a write counter 1102, a plurality of FIFO registers 1104, a read counter 1106, and a comparison module 1108. In this particular embodiment, comparison module 1108 includes a plurality of phase detectors, e.g., three phase detectors, 1112-1114, and a binary decoder 1115. In this particular embodiment, multiple phases of write counter 1102 are sampled with read counter 1106. Multi-phase system 1100 is configured to provide additional granularity by including multiple phase detectors (e.g., 1112-1114) and sampling a greater number of phases from write counter 1102. In this manner, phase detector 1112 may be represented as one of the clocked phases of read counter 1106 with one of the data inputs (phases) of write counter 1102. It should be noted that while three phase detectors 1112-1114 are illustrated, fewer or more phase detectors could also be implemented in other embodiments.

Figure 12:
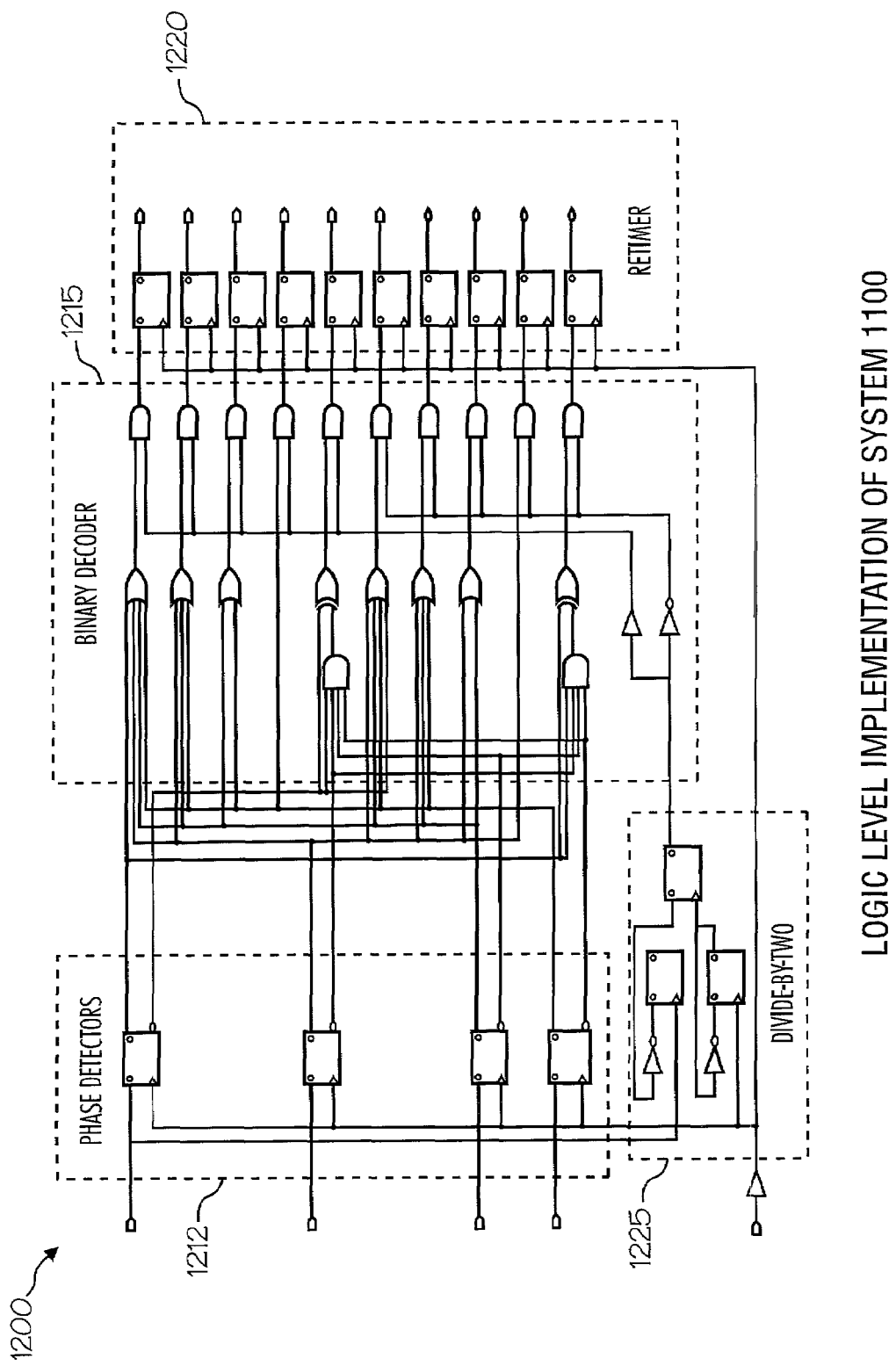

FIG. 12 illustrates one exemplary logic level implementation 1200 of multi-phase detector based FIFO fill level indicator system 1100. In the illustrative Figure, the write and read counters are not shown; however, the inputs to phase detectors 1212 represent the output phases of both the write and read counters. Multiple phase detectors 1112-1114 of system 1100 are shown as phase detectors 1212 which may be implemented as flip flops. A configuration of gate logic forms binary decoder 1215, which receives the outputs of phase detectors 1212. The output is then retimed 1220 by, for example, a plurality of flip flops. Optionally, a divide-by-two circuit 1225 may be included. Divide-by-two circuit 1225 includes a plurality of flip flops and converters configured to detect the overflow and underflow conditions in the FIFO, ensuring that the phase detector continues to indicate the appropriate fill level. This additional feature further aids in maintaining the FIFO at a constant fill level.

It should be appreciated that the particular implementations shown and described herein are illustrative of various embodiments of the invention including its best mode, and are not intended to limit the scope of the present invention in any way. Indeed, for the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical data synchronization system.

The invention has been described above with reference to exemplary embodiments. However, those skilled in the art having read this disclosure will recognize that changes and modifications may be made to the embodiments without departing from the scope of the present invention. These and other changes or modifications are intended to be included within the scope of the present invention, as expressed in the following claims.

The invention claimed is:

1. A dual loop synchronization system comprising:
   a phase lock loop (PLL) having a phase/frequency detector (PFD), a voltage controlled oscillator (VCO), and a phase shifter coupled to said VCO configured in a feedback loop with said PFD, and receiving a local reference clock signal;
   a first-in first-out (FIFO) register receiving a parallel data input;
   a write counter receiving a write clock signal and providing an output to said FIFO register;
   a read counter receiving a read clock signal and providing an output to said FIFO register;
   a comparison module receiving output signals from said write counter and said read counter to generate the fill level of said FIFO register; and
   a delayed lock loop (DLL) having detector coupled to the output of said FIFO register for detecting the fill level and a digital loop filter coupled between said detector and said phase shifter of said PLL to produce a phase shift in the phase shifter of said PLL.

2. A dual loop synchronization system as in claim 1, wherein said PLL is embedded within the DLL.

3. A dual loop synchronization system as in claim 1, wherein said detector coupled to the output of said FIFO register for detecting the fill level of said FIFO register is a phase detector.

4. A dual loop synchronization system as in claim 3, wherein said phase detector coupled to the output of said FIFO register for detecting the fill level of said FIFO register is a binary phase detector.

5. A dual loop synchronization system as in claim 1, wherein said PLL further comprises:
   a loop filter coupled between sad PFD and said VCO.

6. A dual loop synchronization system as in claim 5, wherein the loop filter coupled between said PFD and said VCO is configured as a wide bandwidth loop for suppressing VCO phase noise.

7. A dual loop synchronization system as in claim 1, wherein said digital loop filter coupled between said detector and said phase shifter of said PLL to produce the phase shift in the phase shifter of said PLL is a narrow bandwidth filter.

8. A method for data synchronization in a plesiochronous system comprising the steps of:
   receiving write data in a first-in first-out (FIFO) register;
   detecting the fill level of the FIFO register at the input of a delay locked loop (DLL);
   providing a signal based on the detected fill level to a phase lock loop (PLL);
   receiving a local reference clock signal in the PLL;
   shifting the phase of the local reference clock signal in the PLL in response to the signal based on the detected fill level provided by the DLL.

9. A method for data synchronization in a plesiochronous system as in claim 8, further comprising:
filtering the signal based on the detected fill level in the DLL before providing it to the PLL.

10. A method for data synchronization in a plesiochronous system as in claim 9, wherein the step of filtering is performed in a narrow bandwidth filter.

11. A method for data synchronization in a plesiochronous system as in claim 8, wherein in the step of receiving the local reference dock signal in the PLL, the local reference clock is received at a phase/frequency detector in the PLL and further comprising:
filtering a signal at the output of the phase/frequency detector in a loop filter; and
providing the output of the loop filter to a VCO.

12. A method for data synchronization in a plesiochronous system as in claim 11, wherein the step of filtering is performed in a wide bandwidth filter.

13. A dual loop synchronization system comprising:
a phase lock loop (PLL) having a phase/frequency detector (PFD), a voltage controlled oscillator (VCO), and a phase shifter coupled to said VCO configured in a feedback loop with said PFD, and receiving a local reference clock signal;
a first-in first-out (FIFO) register receiving a parallel data input;
a write counter receiving a write clock signal and providing an output to said FIFO register;
a read counter receiving a read clock signal and providing an output to said FIFO register;
a reset counter receiving input signals from both said write counter and said read counter;
a register receiving input signals from both said reset counter and said read counter to generate the fill level of said FIFO register; and
a delayed lock loop (DLL) having a detector coupled to the output of said FIFO register for detecting the fill level and a digital loop filter coupled between said detector and said phase shifter of said PLL to produce a phase shift in the phase shifter of said PLL.

14. A dual loop synchronization system comprising:
a phase lock loop (PLL) having a phase/frequency detector (PFD), a voltage controlled oscillator (VCO), and a phase shifter coupled to said VCO configured in a feedback loop with said PFD, and receiving a local reference clock signal;
a first-in first-out (FIFO) register receiving a parallel data input;
write counter receiving a write clock signal and providing an output to said FIFO register;
a read counter receiving a read clock signal and providing an output to said FIFO register;
binary decoder;
a plurality of phase detectors receiving input signals from both said write counter and said read counter and providing output signals to said binary decoder to generate the fill level of said FIFO register; and
a delayed lock loop (DLL) having a detector coupled to the output of said FIFO register for detecting the fill level and a digital loop filter coupled between said detector and said phase shifter of said PLL to produce a phase shift in the phase shifter of said PLL.

* * * * *

UNITED STATES PATENT AND TRADEMARK OFFICE
CERTIFICATE OF CORRECTION

PATENT NO. : 7,366,270 B2  Page 1 of 1
APPLICATION NO. : 10/029709
DATED : April 29, 2008
INVENTOR(S) : Tang It is certified that error appears in the above-identified patent and that said Letters Patent is hereby corrected as shown below:

In column 10, line 28, claim 1, delete "from said" and replace with --from both said--;

In column 10, line 48, claim 5, delete "sad" and replace with --said--;

In column 10, line 56, claim 7, delete "of" and replace with --in--;

In column 11, line 10, claim 11, delete "dock" and replace with --clock--;

In column 12, line 17, claim 14, delete "write counter" and replace with --a write counter--;

In column 12, line 21, claim 14, delete "binary" and replace with --a binary--;

Signed and Sealed this

Fifth Day of August, 2008

JON W. DUDAS
*Director of the United States Patent and Trademark Office*